United States Patent
Watanabe et al.

(10) Patent No.: US 8,786,056 B2
(45) Date of Patent: Jul. 22, 2014

(54) SEMICONDUCTOR LIGHT EMITTING ELEMENTS COMPRISING A PLATING SUBSTRATE WITH A PROJECTING TAB, OR COMPRISING AN EXPOSED SEED LAYER

(75) Inventors: Kentaro Watanabe, Anan (JP); Giichi Marutsuki, Itano-gun (JP); Yuya Yamakami, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 56 days.

(21) Appl. No.: 13/156,150

(22) Filed: Jun. 8, 2011

(65) Prior Publication Data

US 2011/0303894 A1    Dec. 15, 2011

(30) Foreign Application Priority Data

Jun. 9, 2010 (JP) ................. 2010-131873

(51) Int. Cl.
*H01L 23/544* (2006.01)
(52) U.S. Cl.
USPC ........ 257/620; 257/79; 257/88; 257/E33.005; 438/33; 438/458; 438/462
(58) Field of Classification Search
None
See application file for complete search history.

(56) References Cited

U.S. PATENT DOCUMENTS

| | | | |
|---|---|---|---|
| 7,473,571 B2 | 1/2009 | Hwang et al. | |
| 8,097,478 B2 | 1/2012 | Hodota | |
| 8,217,568 B2 | 7/2012 | Matsumura | |
| 2005/0186760 A1* | 8/2005 | Hashimura et al. | 438/460 |
| 2007/0114552 A1 | 5/2007 | Jang et al. | |
| 2008/0286938 A1* | 11/2008 | Pu et al. | 438/458 |
| 2009/0283793 A1 | 11/2009 | Osawa et al. | |
| 2010/0120228 A1* | 5/2010 | Saito et al. | 438/463 |
| 2010/0136727 A1 | 6/2010 | Osawa et al. | |
| 2010/0230705 A1* | 9/2010 | Jeong | 257/98 |

FOREIGN PATENT DOCUMENTS

| | | |
|---|---|---|
| JP | 2001-244503 | 9/2001 |
| JP | 2007-081312 | 3/2007 |
| JP | 2007-088048 | 4/2007 |
| JP | 2007-103934 A | 4/2007 |
| JP | 2007-142368 | 6/2007 |
| WO | WO2009-004980 A1 | 1/2009 |
| WO | WO2009-041318 A1 | 4/2009 |

OTHER PUBLICATIONS

Notification of Reasons for Rejections, Japanese Application No. 2010-131873 dated Nov. 12, 2013.

\* cited by examiner

*Primary Examiner* — Marcos D. Pizarro
*Assistant Examiner* — Cesar Lopez
(74) *Attorney, Agent, or Firm* — Foley & Lardner LLP (57) ABSTRACT

A method of forming a semiconductor light emitting element. The method can include forming a seed layer on a semiconductor layer assembly including at least one nitride semiconductor layer. An insulating mask can be formed on the seed layer. The insulating mask can include a plurality of element areas separated by cross spaces. Each element area of the plurality of element areas can be connected to at least one of the other element areas of the plurality of element areas. The seed layer can be plated such that a plating substrate is formed in each of the plurality of element areas.

32 Claims, 11 Drawing Sheets

SEMICONDUCTOR LIGHT EMITTING ELEMENTS COMPRISING A PLATING SUBSTRATE WITH A PROJECTING TAB, OR COMPRISING AN EXPOSED SEED LAYER

CROSS-REFERENCE TO RELATED PATENT APPLICATIONS

This application claims the benefit of foreign priority, under 35 U.S.C. §119, to Japanese Patent Application Number 2010-131873, filed on Jun. 9, 2010, the contents of which are hereby incorporated by reference in their entirety.

BACKGROUND

The present invention relates to an apparatus and a fabrication method of a semiconductor light emitting element using a metal substrate, and more particularly relates to an apparatus and a fabrication method of a semiconductor light emitting element that can include forming a metal substrate on a nitride semiconductor.

A nitride semiconductor device is capable of emitting a high-power, short-wavelength light, and can be widely used as a white light LED (Light Emitting Diode) that combines, for example, a blue or green LED and a fluorescent material. In addition, the nitride semiconductor device has been actively studied in recent years for use as a high-speed electronic device such as a HEMT (High Electron Mobility Transistor).

A nitride semiconductor device can be fabricated by homoepitaxially growing a nitride semiconductor layer on a gallium nitride (GaN) substrate that is identical to the semiconductor to be grown. However, a GaN substrate is expensive. Therefore, in general, a nitride semiconductor device is usually fabricated by heteroepitally growing the nitride semiconductor layer on a substrate (growth substrate) such as sapphire that is different from the semiconductor to be grown.

Since sapphire is an insulator, it is difficult to fabricate a vertical semiconductor device on sapphire. In addition, since sapphire has a low thermal conductivity, it is difficult to fabricate a semiconductor device where a large current flows.

A nitride semiconductor device can be formed on a conductive substrate on a nitride semiconductor layer (See Japanese Patent Application Publication No. 2001-244503). The nitride semiconductor device described in Japanese Patent Application Publication No. 2001-244503 is fabricated as follows. A conductive substrate that is a hetero-substrate is grown on a nitride semiconductor layer which was heteroepitaxially grown on a sapphire substrate during a wafer process for fabricating a plurality of devices at one time. The nitride semiconductor layer is transferred to the conductive substrate by peeling off the sapphire substrate and is diced into an individual chip.

In addition, a nitride semiconductor device can be formed on a plated metal substrate, which is conductive and has a high thermal conductivity, on a nitride semiconductor instead of using a metal plate (See, for example, Japanese Patent Application Publication No. 2007-142368, Japanese Patent Application Publication No. 2007-081312, and Japanese Patent Application Publication No. 2007-088048). For example, the fabrication method of the nitride semiconductor device described in Japanese Patent Application Publication No. 2007-081312 is as follows. When a plurality of devices are fabricated, a nitride semiconductor layer is separated in advance by forming grooves on a growth substrate corresponding to each of the devices to be fabricated. The grooves of the nitride semiconductor layer are filled with a sacrificial layer and a plating substrate is formed on a p-type semiconductor layer as well as the sacrificial layer by plating. After the growth substrate is peeled off, the sacrificial layer is removed and the plating substrate is divided into devices.

When a support substrate is formed by metal plating using, for example, the fabrication method described in Japanese Patent Application Publication No. 2001-244503, there are various problems since the plating layer is thinner than a metal plate. For example, after the growth substrate is peeled off, if the nitride semiconductor layer and the plating substrate are warped due to warpage distortion by a stress of the metal plating, wafer processes become difficult to conduct. In addition, for example, dicing of the metal plating becomes difficult. Furthermore, if the support substrate is formed for each individual separate device by metal plating in order to avoid the problems in the wafer process, the mass-productivity becomes poor.

For example, according to the technology described in Japanese Patent Application Publication No. 2007-081312, effects of warpage of the semiconductor layer after the growth substrate is peeled off can be reduced by forming grooves on the growth substrate and separating the nitride semiconductor layer in advance so as to correspond to each of the devices. However, the fabrication process becomes complex since a filling process for filling the grooves with a sacrificial layer and a process for removing the sacrificial layer after the filling process are required.

SUMMARY

An illustrative fabrication method of a semiconductor light emitting element can be used to fabricate a plurality of elements using a plating substrate as a support substrate. The method can include the operations of: forming a nitride semiconductor layer on a growth substrate, the nitride semiconductor layer including at least an n-type nitride semiconductor layer, an active layer made of a nitride semiconductor, and a p-type nitride semiconductor layer stacked in this order; forming a p-electrode layer on an upper surface of the nitride semiconductor layer so as to correspond to each element; covering the upper surface of the nitride semiconductor layer by forming a p-passivation layer between the p-electrode layers formed on the upper surface of the nitride semiconductor layer; forming a seed layer on the p-electrode layer and the p-passivation layer; forming an insulating layer partially on a boundary between the elements on an upper surface of the seed layer; forming a plating layer on the seed layer; forming the plating substrate by removing the insulating layer and forming a space partially in the plating layer on the boundary between the elements; peeling off the growth substrate from the nitride semiconductor layer; forming a groove in the nitride semiconductor layer along the boundary between the elements from a surface of the nitride semiconductor layer at a side of an n-type nitride semiconductor layer, the surface appeared by peeling off the growth substrate; forming an n-electrode layer on the surface of the nitride semiconductor layer at the side of the n-type nitride semiconductor layer so as to correspond to each element; and cutting the plating substrate along the boundary between the elements. Advantageously, the semiconductor light emitting element and fabrication method are simple and exhibit excellent mass production characteristics by reducing warpage of a semiconductor layer and a plating substrate.

Accordingly, since the fabrication method of a semiconductor light emitting element forms a space partially in the plating layer on the boundary between the elements at the p-side of the nitride semiconductor layer, and thus forming the plating substrate, individual elements are connected together through the space formed in the plating substrate at this stage. After the plating substrate is formed from the plating layer in this fashion and the growth substrate is peeled off from the nitride semiconductor layer, the stress of the metal plating can be released by the space of the plating substrate, and thus the warpage of the nitride semiconductor layer and the plating substrate can be reduced. In addition, since the warpage of the nitride semiconductor layer and the plating substrate is reduced in this fashion, the groove can be easily formed in the nitride semiconductor layer on the plating substrate after the growth substrate is peeled off. Furthermore, in the step of cutting the plating substrate along the boundary between the elements, it is unnecessary to cut the nitride semiconductor layer and it is sufficient if only the p-passivation layer and seed layer are cut at a portion where the space is present in the plating substrate. Hence, a portion connecting adjoining elements between a space of the plating substrate and another space thereof can be easily cut. Accordingly, unlike the conventional technologies of reducing the warpage, a process of forming grooves in the nitride semiconductor layer before peeling off the growth substrate from the nitride semiconductor layer and filling the grooves with a sacrifice layer and a process of removing the sacrifice layer are unnecessary.

In addition, according to the fabrication method of a semiconductor light emitting element of the present invention, it is preferable that the seed layer and the plating layer are made of the same material. This improves the adhesiveness of the plating layer.

In addition, it is preferable that the plating substrate is made of materials selected from at least one of Ni, Cu, or Au. Accordingly, the plating layer can be easily and selectively formed at a portion where no insulating layer is formed. Furthermore, it is preferable that the insulating layer is a resist that can be easily removed.

According to an illustrative embodiment, a semiconductor light emitting element and a fabrication method of a semiconductor light emitting element that has a metal plating substrate which is less in warpage distortion during the wafer process, easy in the dicing, and excellent in mass production can be provided.

BRIEF DESCRIPTION OF THE DRAWINGS

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

FIG. 1A to FIG. 1C are external views of an element assembly to be obtained in a fabrication process of a semiconductor light emitting element before separating/dicing according to the present invention.

FIG. 2A and FIG. 2B are configuration diagrams of a semiconductor light emitting element according to the present invention.

FIG. 3A to FIG. 3C are illustrations showing one example of a fabrication process of a semiconductor light emitting element according to the present invention.

FIG. 4A and FIG. 4B are illustrations showing one example of a fabrication process of a semiconductor light emitting element according to the present invention.

FIG. 5A and FIG. 5B are illustrations showing one example of a fabrication process of a semiconductor light emitting element according to the present invention.

FIG. 6A to FIG. 6D are cross sectional views taken along the B-B lines showing one example of a fabrication process of a semiconductor light emitting element according to the present invention.

FIG. 7A to FIG. 7D are illustrations showing the plating layer formation process of FIG. 6B.

FIG. 8A to FIG. 8C are illustrations showing a status after the substrate peeling-off process of FIG. 6D.

FIG. 9A to FIG. 9C are illustrations showing one example of a fabrication process of a semiconductor light emitting element according to the present invention.

FIG. 10A and FIG. 10B are cross sectional views taken along the B-B lines showing one example of a fabrication process of a semiconductor light emitting element according to the present invention, FIG. 11A and FIG. 11B are cross sectional views taken along the B-B lines showing one example of a fabrication process of a semiconductor light emitting element according to the present invention.

DETAILED DESCRIPTION OF THE ILLUSTRATIVE EMBODIMENTS

Figure 1A:
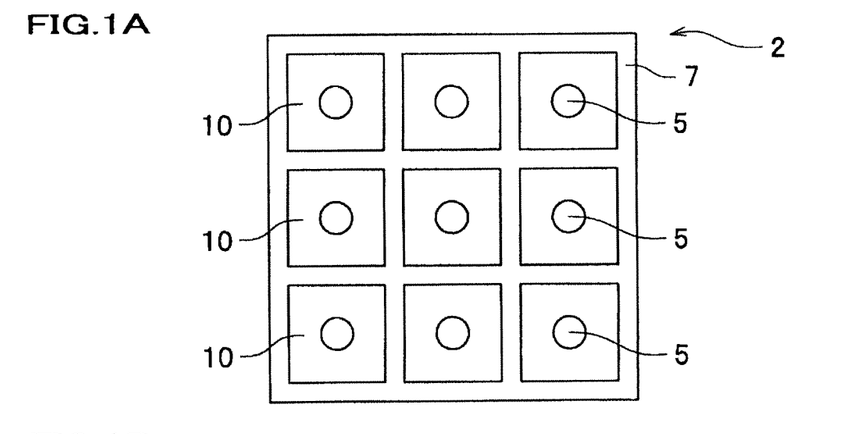
FIG. 1A is a plan view of the element assembly as seen from a light emitting side.
Figure 1B:
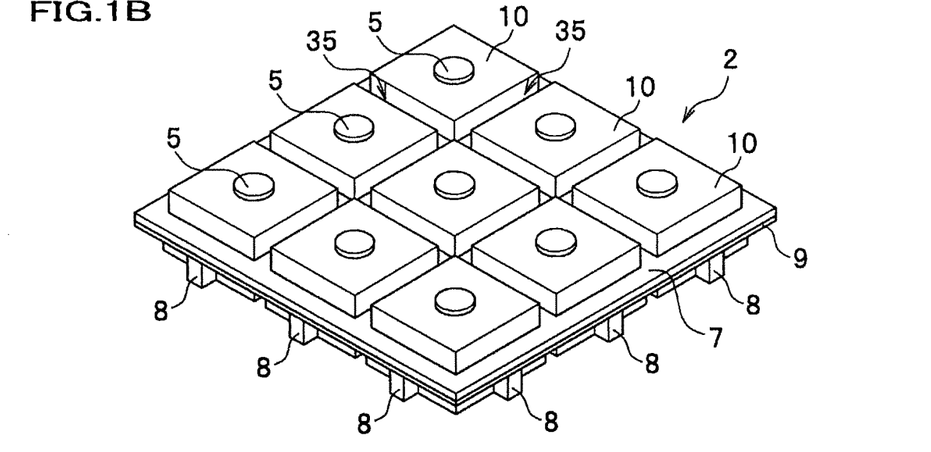
FIG. 1B is a perspective view of the element assembly as seen from the light emitting side and FIG. 1C is a perspective view of the element assembly as seen from a substrate side.
Figure 1C:
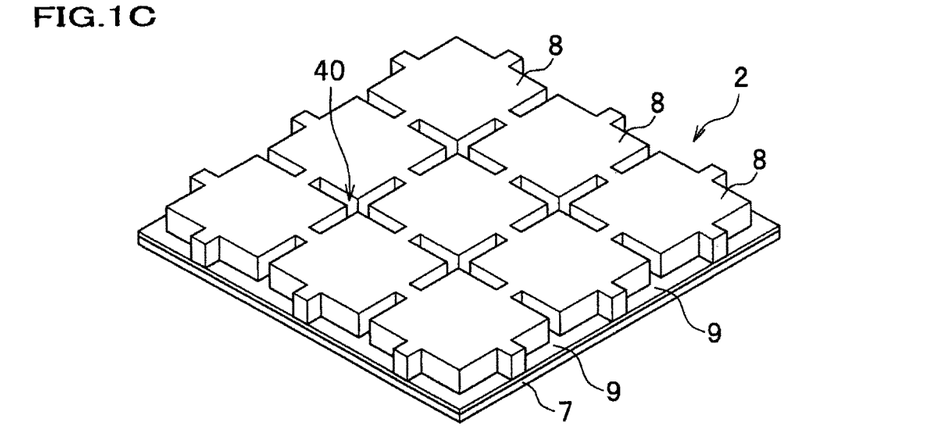

Hereinafter, an explanation will be given in detail of an illustrative embodiment of a fabrication method of a semiconductor light emitting element according to the present invention by referring to drawings. An element assembly before separating into each element, which is produced by the fabrication method of the semiconductor light emitting element according to the present invention, is shown in FIG. 1A to FIG. 1C, and the separated semiconductor light emitting element is shown in FIG. 2A and FIG. 2B.

Structure of Semiconductor Light Emitting Element

Figure 2A:
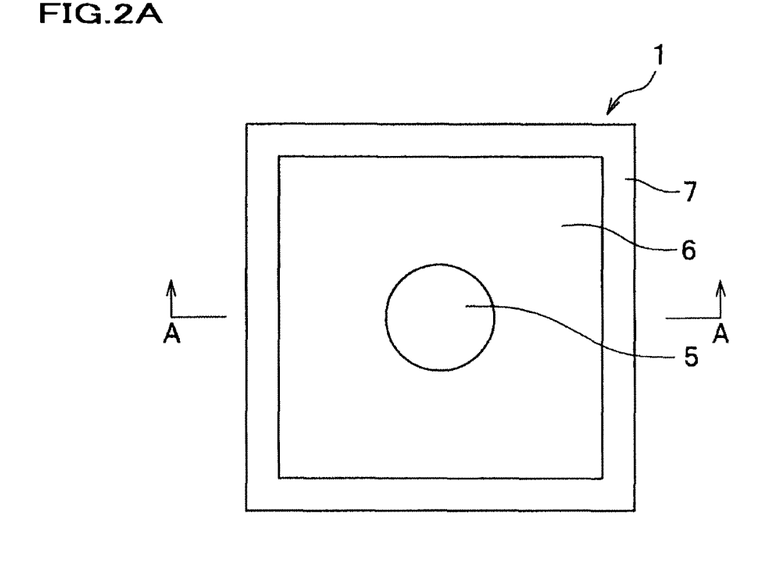
FIG. 2A is a plan view of the semiconductor light emitting element as seen from a light emitting side and FIG. 2B is a cross sectional view taken along A-A line of FIG. 2A.
Figure 2B:
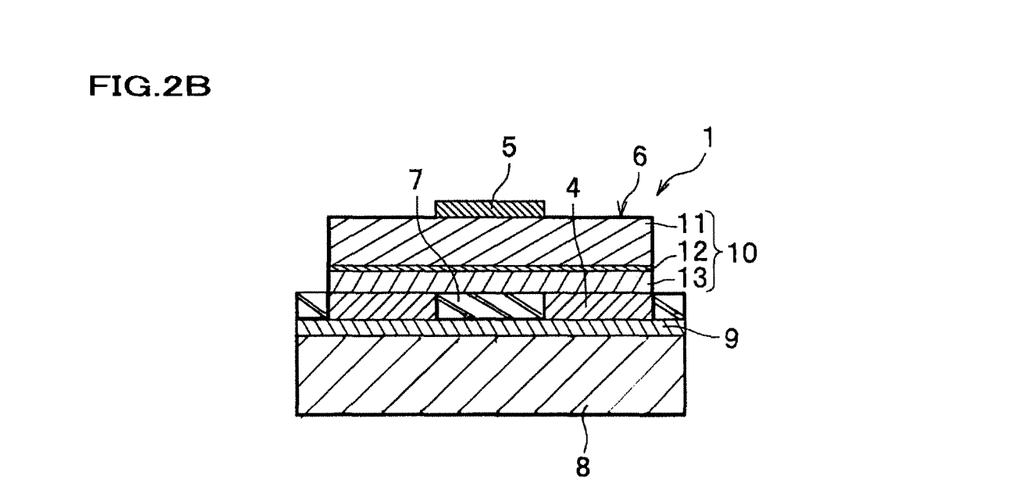

As shown in FIG. 2A and FIG. 2B, a semiconductor light emitting element 1 includes a nitride semiconductor layer 10, a p-electrode layer 4, a p-passivation layer 7 and a seed layer 9, which are formed on a surface of a plating substrate 8. The nitride semiconductor layer 10 includes an n-type nitride semiconductor layer 11, an active layer 12 made of a nitride semiconductor and a p-type nitride semiconductor layer 13. For example, the p-type nitride semiconductor layer 13, the active layer 12 and the n-type nitride semiconductor layer 11 are stacked in this order on the p-type electrode layer 4 and the p-passivation layer 7. An n-electrode layer 5 is formed on an upper surface of the nitride semiconductor layer 10. An n-passivation layer 6 is formed on the upper surface of the nitride semiconductor layer 10 except for a portion of the n-electrode layer 5 and on a side face of the nitride semiconductor layer 10 so as to cover the nitride semiconductor layer 10. Meanwhile, each part of the semiconductor light emitting element will be explained in detail later.

Structure of Element Assembly

In the element assembly 2 shown in FIG. 1A to FIG. 1C, an element identical to that of the semiconductor light emitting element 1 is given the same reference. The element assembly 2 shows a state before the n-passivation layer 6 is formed. In FIG. 1A, as an example, the element assembly 2 having nine elements of 3×3 is shown. It is noted that other elements are arranged in a similar manner around these nine elements. The nitride semiconductor layer 10 can have a substantially square shape in planar view.

On a light emitting side (front side) of the element assembly 2, as shown in FIG. 1B, grooves 35 having a predetermined width are formed in the longitudinal direction and the lateral direction along boundaries between elements. As shown in FIG. 1A, a width of the grooves 35 in the longitudinal direction is equal to that in the lateral direction in planar view, and a cross-shaped portion is formed at a cross point of the grooves 35 in the longitudinal direction and the lateral direction. When the element assembly is cut at the center line of the grooves 35, the element assembly is separated into an individual semiconductor light emitting element 1. A dicing street is a region narrower than the width of the grooves 35, which passes through the center line of the grooves 35. By the dicing street as a boundary, a region which is formed so as to correspond to the semiconductor light emitting element 1 is simply referred to as an element. Each element can have a substantially rectangular shape in planar view.

On a substrate side (rear side) of the element assembly 2, as shown in FIG. 1C, a plating substrate 8 of an element and a plating substrate 8 of an adjoining element are connected together via a part of the plating layer. In addition, spaces 40 are formed on a part of boundaries between elements. The spaces 40 are each cross-shaped and formed at a position opposite to the cross-shaped portion at a cross point of the grooves 35 in the longitudinal direction and the lateral direction formed on the light emitting side of the element assembly 2. The spaces 40 are the part of the dicing streets, and the width of the cross-shaped space 40 opposite to the grooves 35 can be narrower than that of the groove 35. That is, the width of the groove 35 can be set to be wider than the width of the space 40. The spaces 40 can be formed so as to have an equal thickness to that of the plating substrate 8, and do not pass through the element assembly 2. In addition, a space 40 can be formed for each four elements that are two by two. That is, in the plating substrates 8, adjoining two elements are connected together via the plating layer between a space 40 and another space 40 on the boundaries. Since a stress of metal plating is released by the spaces 40, the element assembly 2 can allow for reduced warpage of the nitride semiconductor layer 10 and the plating substrate 8.

Structure of Each Part of Semiconductor Light Emitting Element (p-Electrode Layer)

The p-electrode layer 4 can be formed of a material that can be normally used as an electrode. Examples of such are metals, such as zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chrome (Cr), tungsten (W), lanthanum (La), copper (Cu), silver (Ag), and yttrium (Y), and alloys, such as Ni—Au and Ni—Pt.

(n-Electrode Layer)

The n-electrode layer 5 can be formed of a material that can be normally used as an electrode. In addition, the n-electrode layer 5 may be formed of two metals stacked in the order of Ti/Al from the plating-substrate 8 side. Likewise, the n-electrode layer 5 may be formed of equal to or greater than three kinds of metals stacked in an order, such as Ti/Pt/Au, Ti/Al/Pt/Au, W/Pt/Au, or V/Pt/Au.

(n-Passivation Layer and p-Passivation Layer)

The n-passivation layer 6 can be an insulating film, for example, an oxide film. The n-passivation layer 6 can be formed of, for example, a Zr oxide film (ZrO2) or SiO2. The n-passivation layer 6 can be fanned through a conventional technique, such as sputtering, ECR (Electron Cyclotron Resonance) sputtering, CVD (Chemical Vapor Deposition), ECR-CVD, ECR-plasma CVD, evaporation, and EB (Electron Beam) deposition. Among those techniques, formation through, for example, ECR sputtering, ECR-CVD or ECR-plasma CVD is preferable. The same is true of the p-passivation layer 7.

(Plating Substrate)

The plating substrate 8 can be formed of a material that is a metal which can be plated. The material of the plating substrate 8 can be selected from, for example, at least one of following: Ni, Cu, or Au. According to such a selection, a plating layer can be easily and selectively formed through electrolytic plating on a portion where no insulating layer is formed. Hence, in a process of forming the plating substrates 8 through electrolytic plating using a metal as a material, an insulating layer is formed in advance at a portion where the plating layer is not formed such as the space 40 of the plating substrate 8. The plating substrate 8 can have a thickness of greater than or equal to 80 micrometers and less than or equal to 120 micrometers, however, any thickness can be used.

(Seed Layer)

Example materials of the seed layer 9 are a metal, such as Ni, Cu, or Au and an alloy thereof depending on the material of the plating substrate 8. If the material of the seed layer 9 is the same as that of the plating layer, the adhesiveness improves so that it is preferable to use the same material. The seed layer 9 can be formed through a conventional technique, such as sputtering or evaporation. The seed layer 9 can have a thickness of greater than or equal to 0.1 micrometers and less than or equal to 0.5 micrometers, however, any thickness can be used.

(Nitride Semiconductor Layer)

In the nitride semiconductor layer 10, either one of or both of a n-type nitride semiconductor layer 11 and a p-type nitride semiconductor layer 13 may be formed of a plurality of nitride semiconductor layers. In addition, the active layer 12 may be a single layer or multilayer. Accordingly, respective n-type nitride semiconductor layer 11 and p-type nitride semiconductor layer 13 can be formed of a plurality of layers corresponding to necessary functions, such as a contact layer and a clad layer, which realize a light emitting characteristic in accordance with an application.

An example of the contact layer of the n-type nitride semiconductor layer 11 is an Si-doped n-type GaN layer and an example of the clad layer of the n-type nitride semiconductor layer 11 is a Si-doped n-type AlGaN layer. An example of the contact layer of the p-type nitride semiconductor layer 13 is a Mg-doped p-type GaN layer, and an example of the clad layer of the p-type nitride semiconductor layer 13 is a Mg-doped p-type AlGaN layer. Examples of the active layer 12 are an InGaN layer, a single or multiple quantum well layer of GaN and InGaN, or a single or multiple quantum well layer of InGaN well layer having a different composition ratio from a InGaN barrier layer. The n-type nitride semiconductor layer 11 and the p-type nitride semiconductor layer 13 each may further include an undoped nitride semiconductor layer.

Fabrication Method of Semiconductor Light Emitting Element

The fabrication method of the semiconductor light emitting element according to the embodiment of the present invention is a fabrication method of a plurality of semiconductor light emitting elements using a plating substrate as a support substrate. Fabrication processes up to dicing into individual semiconductor light emitting element 1 will be explained with reference to FIG. 3A to FIG. 10B.

Figure 3A:
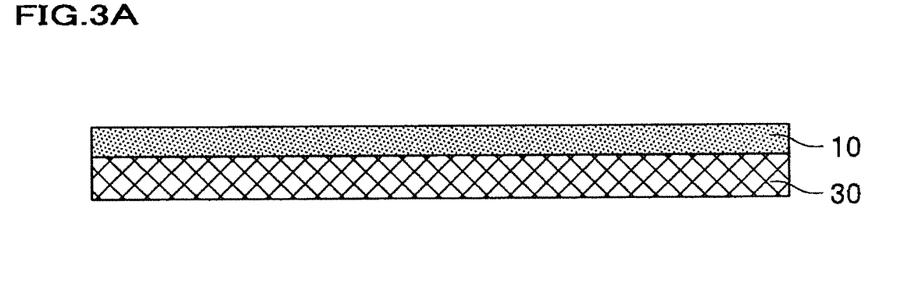
FIG. 3A is a cross sectional view showing a nitride semiconductor layer formation process.

First, as shown in FIG. 3A, the nitride, semiconductor layer 10 can be grown on a growth substrate 30 such as a sapphire substrate through, for example, metal-organic chemical vapor deposition (MOCVD). At this time, the n-type nitride semiconductor layer 11, the active layer 12 and the p-type nitride semiconductor layer 13 are stacked on the growth substrate 30 in this order, thereby forming the nitride semiconductor layer 10. That is, the upper layer of the nitride semiconductor layer 10 is the p-type nitride semiconductor layer 13 which is turned over from the cross sectional view of FIG. 2B.

Figure 3B:
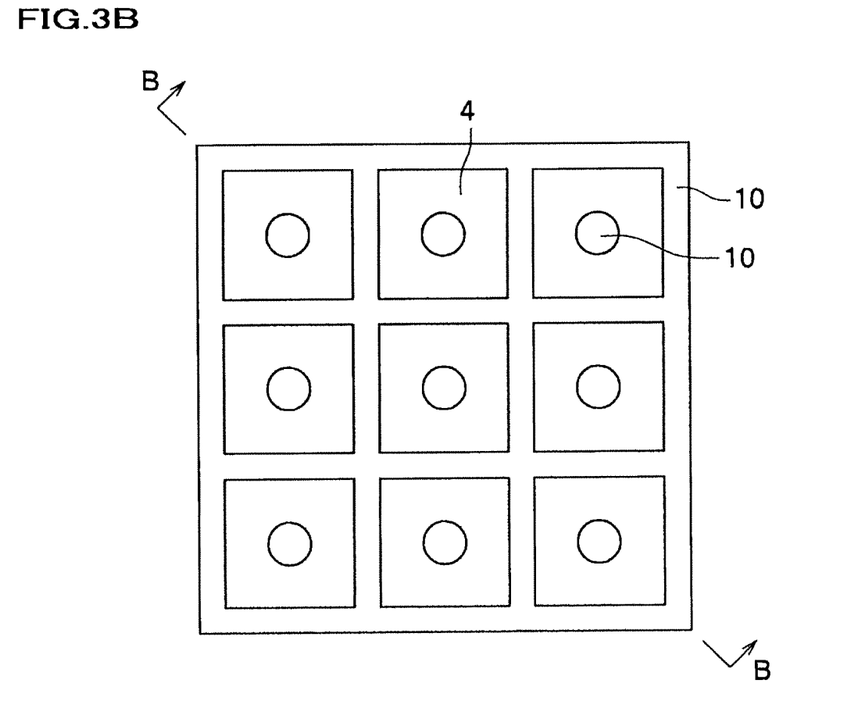
FIG. 3B is a plan view showing a p-electrode layer formation process and FIG. 3C is a cross sectional view taken along B-B line of FIG. 3B.
Figure 3C:
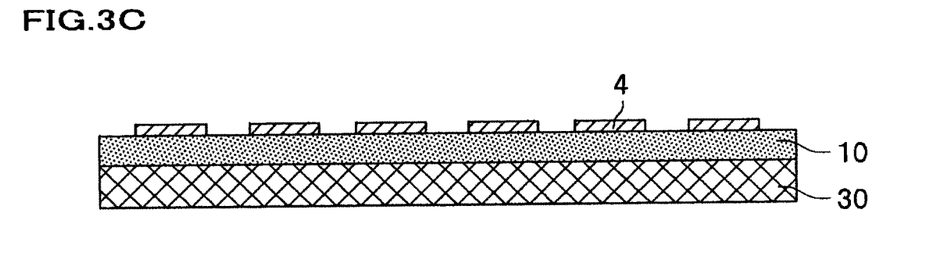

Next, as shown in FIG. 3B and FIG. 3C, the p-electrode layer 4 is formed on the upper surface of the nitride semiconductor layer 10 so as to correspond to each element. That is, the p-electrode layer 4 is formed at the position under the nitride semiconductor layer 10 shown in, for example, FIG. 1B. At this time, no film is formed at a position under the portion where the n-electrode layer 5 is formed through the later process and positions under portions where the grooves 35 are formed, and spaces are left. The widths of respective spaces under the portions where the grooves 35 are formed are set to be wider than the width of the space 40 to be formed through the later process. Forming the p-electrode layer 4 is not limited to any particular technique, but for example, magnetron sputtering can be used. The cross sectional view following FIG. 3C is mainly a cross sectional view taken along B-B line in FIG. 3B.

Figure 4A:
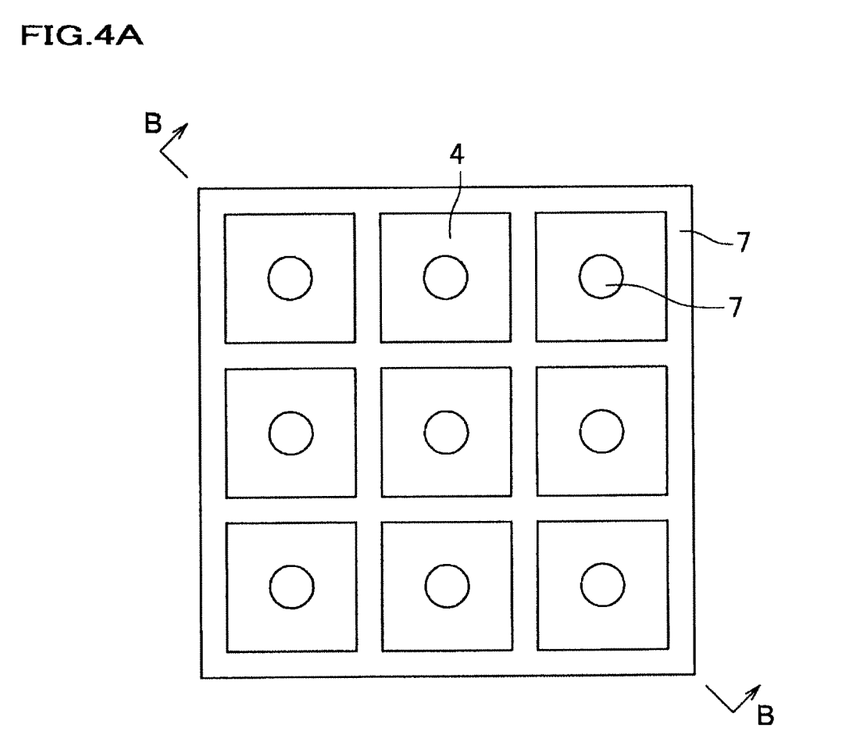
FIG. 4A is a plan view showing a p-passivation layer formation process and FIG. 4B is a cross sectional view taken along B-B line of FIG. 4A.
Figure 4B:
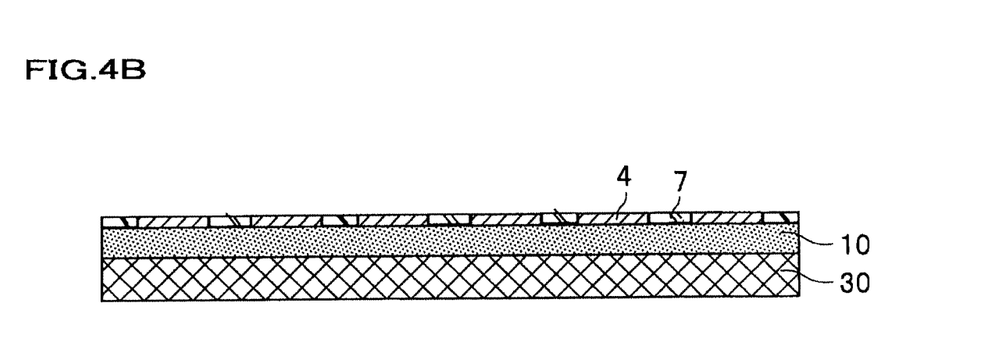

Next, as shown in FIG. 4A and FIG. 4B, the p-passivation layer 7 is formed in-between the gaps of the p-electrode layer 4 formed on the upper surface of the nitride semiconductor layer 10 in order to cover the upper surface of the nitride semiconductor layer 10. That is, at this time, the p-passivation layer 7 is formed under a portion where the n-electrode layer 5 is formed through the later process. This improves the light emitting efficiency. At the same time, also, the p-passivation layer 7 is formed under portions where the grooves 35 that are the dicing streets are formed through the later process. A width of the p-passivation layer 7 that is formed at a position under the portion corresponding to the dicing street is formed wider than that of the dicing street. That is, the width of the p-passivation layer 7 formed at this position is set to be wider than the width of the space 40 formed through the later process. Such a configuration suppresses leakage. Forming the p-passivation layer 7 is not limited to any particular technique, but for example, ECR sputtering can be used.

Figure 5A:
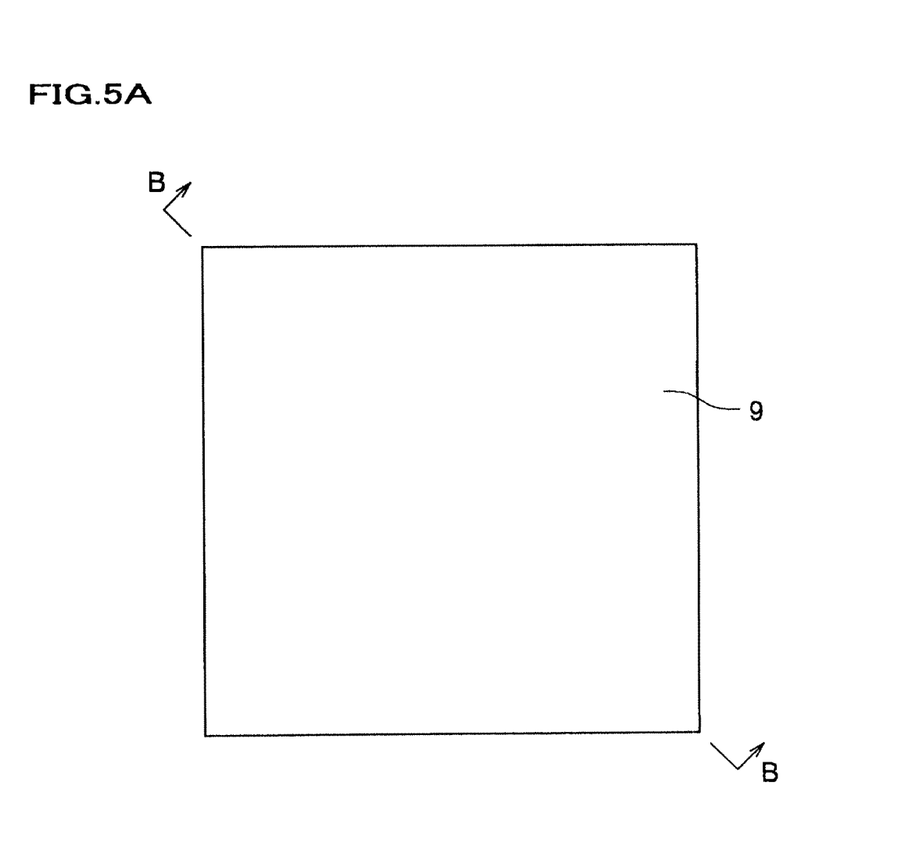
FIG. 5A is a plan view showing a seed layer formation process and FIG. 5B is a cross sectional view taken along B-B line of FIG. 5A.
Figure 5B:
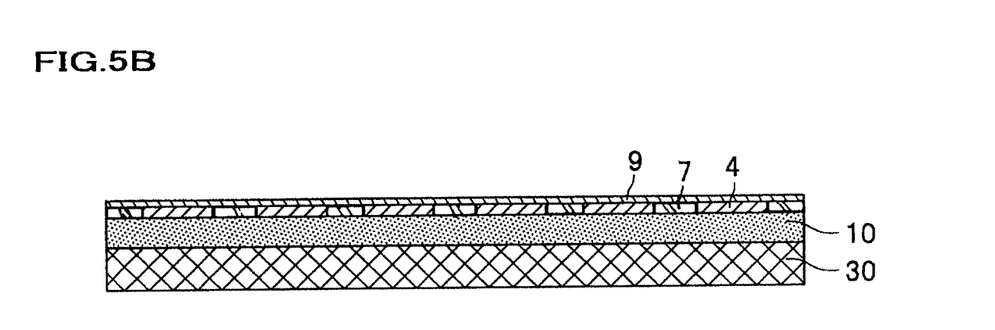

Next, as shown in FIG. 5A and FIG. 5B, the seed layer 9 is formed on the p-electrode layer 4 and the p-passivation layer 7. The seed layer 9 can cover the whole upper surface of the nitride semiconductor layer 10 via the p-electrode layer 4 and the p-passivation layer 7. Also, the seed layer 9 can partially cover the upper surface of the nitride semiconductor layer 10 as long as it covers a portion where the space 40 is formed through the later process. The seed layer 9 can be formed through, for example, sputtering.

Figure 6A:
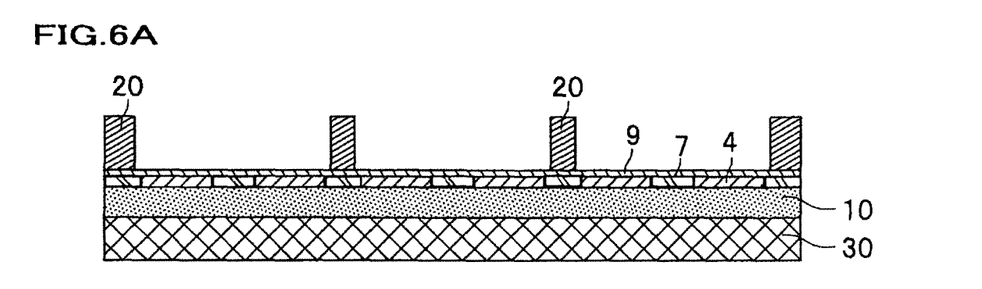
FIG. 6A is an insulator layer formation process.

Next, as shown in FIG. 6A, an insulating layer 20 is partially formed on the boundaries between the elements on the upper surface of the seed layer 9. The insulating layer 20 is provided in order to form the spaces 40, partially, in the plating layer through the later process. The insulating layer 20 may be, for example, a resist normally used for masking and patterning so that such insulating layer can be easily removed in the later process. When, for example, conventional photolithography such as a general patterning is used, the portion where the space 40 shown in FIG. 1C is formed can be covered by, for example, a photo-resist. That is, in this case, portions other than the portion where the plating substrate 8 of an element and the plating substrate 8 of adjoining element can be partially connected together on the seed layer 9 are covered by the photo-resist. This enables, as shown in the cross sectional view of FIG. 6A, formation of the insulating layer 20 on the p-passivation layer 7 that is formed under portions corresponding to the dicing streets via the seed layer 9 amongst all of the p-passivation layers 7. No insulating layer 20 is formed on the p-passivation layer 7 that is formed under a portion corresponding to the n-electrode layer 5 through the later process.

Figure 6B:
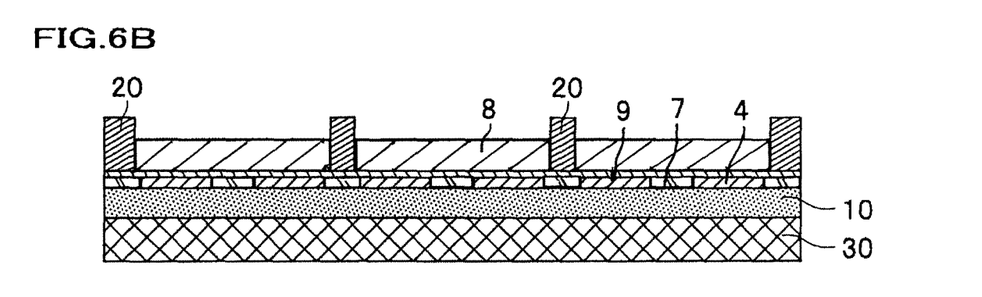
FIG. 6B is a plating layer formation process.

Next, as shown in FIG. 6B, the plating layer can be formed on the seed layer 9. When plating is applied, both electrolytic plating and electroless plating are appropriate. For example, using Ni electrolytic plating, the plating substrate 8 formed of the Ni plating can be formed on the seed layer 9 other than the portions covered by the insulating layer 20.

An explanation will be given of the shape of the plating substrate 8 with reference to FIG. 7A to FIG. 7D.

Figure 7A:
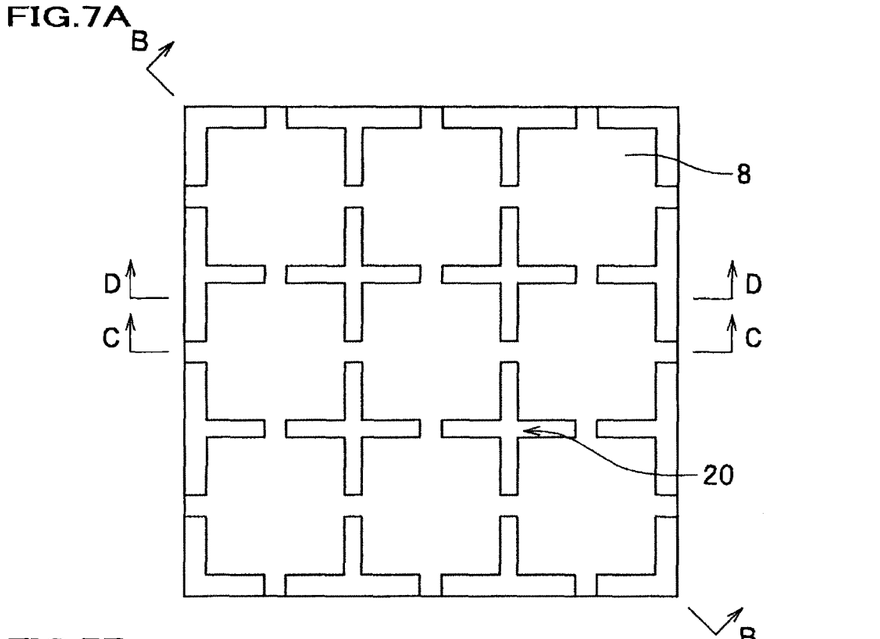
FIG. 7A is a plan view.
Figure 7B:
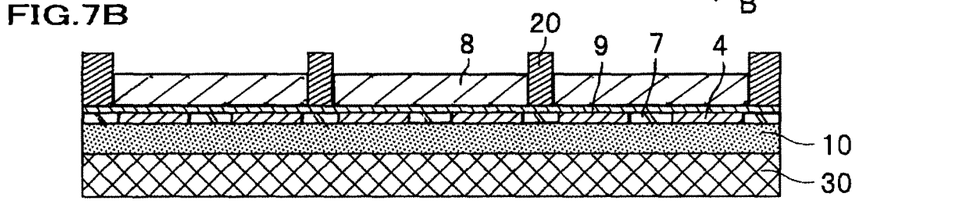
FIG. 7B is a cross sectional view taken along B-B line of FIG. 7A.
Figure 7C:
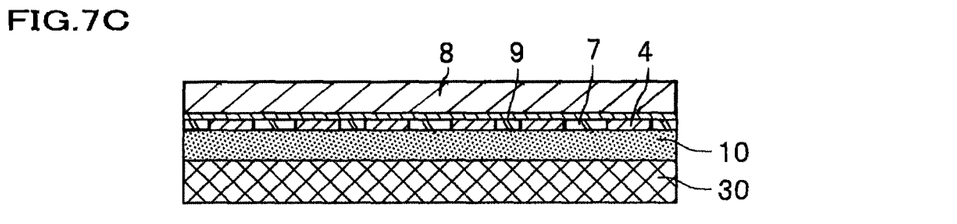
FIG. 7C is a cross sectional view taken along C-C line of FIG. 7A
Figure 7D:
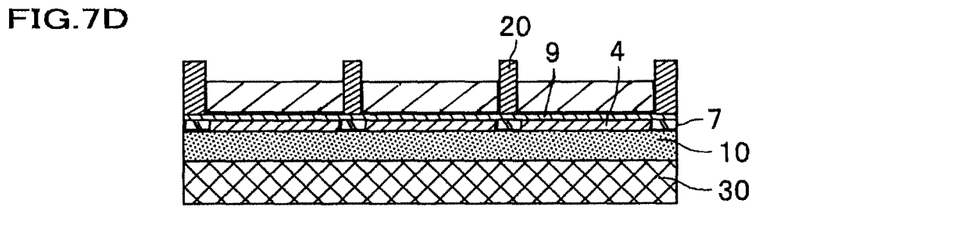
FIG. 7D is a cross sectional view taken along D-D line of FIG. 7A.

FIG. 7A is a plan view of the plating substrate 8 formed on portions other than the portions covered by the insulating layer 20. FIG. 7B is a cross sectional view taken along B-B line of FIG. 7A. FIG. 7C is a cross sectional view taken along C-C line of FIG. 7A. FIG. 7D is a cross sectional view taken along D-D line of FIG. 7A.

As shown in the cross sectional view of FIG. 7B taken along B-B line and the cross sectional view of FIG. 7D taken along D-D line, the insulating layer 20 is formed in the plating layer and between adjoining elements. On the other hand, as shown in the cross sectional view of FIG. 7C taken along C-C line, the plating substrate 8 is continuously formed between adjoining elements in the plating layer. Meanwhile, as shown in the cross sectional view of FIG. 7D taken along D-D line, the p-passivation layer 7 is formed under the insulating layer 20, and as shown in the cross sectional view of FIG. 7B taken along B-B line, the p-passivation layer 7 is formed under the insulating layer 20 and under a portion corresponding to the n-electrode layer 5 through the later process.

Figure 6C:
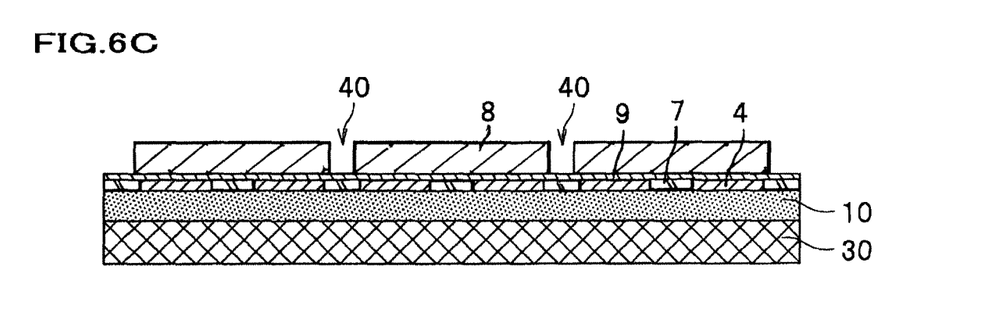
FIG. 6C is an insulator layer removal process and FIG. 6D is a substrate peeling-off process.

After the plating layer is formed, as shown in FIG. 6C, by removing the insulating layer 20, the spaces 40 can be formed in the plating layer on the boundaries between the elements, and the plating substrate 8 is thus formed. The spaces 40 can be cross-shaped (i.e., cross spaces). The spaces 40 can include four rectangular legs. Each of the four rectangular legs can have a length less than half of a side length of a plating substrate 8. The width of each of the four rectangular legs of spaces 40 can be greater than or equal to 40 micrometers, however, any width can be used.

Figure 6D:
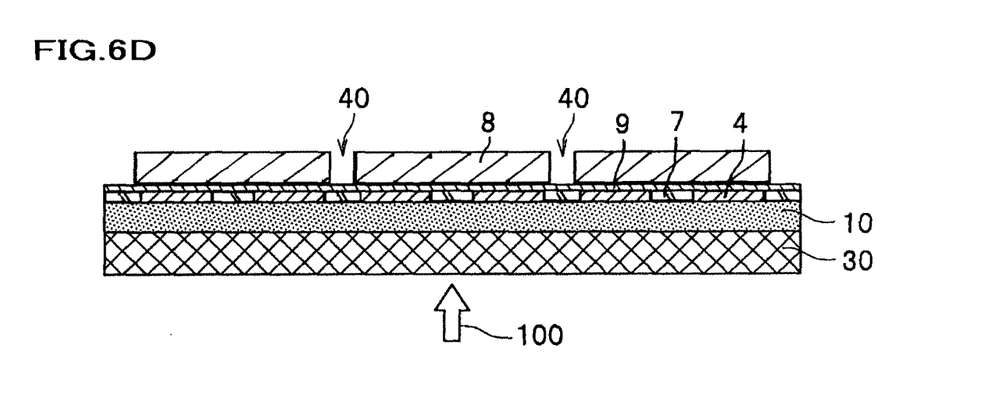

Next, as shown in FIG. 6D, from an opposite surface to the side where the nitride semiconductor layer 10 is formed on the growth substrate 30, as indicated by an arrow 100, the nitride semiconductor layer 10 can be irradiated with a laser having a specific wavelength. Accordingly, the growth substrate 30 can be peeled off of the nitride semiconductor layer 10. In this process, a laser beam which can pass through the growth substrate 30 formed of sapphire and which is absorbed by the n-type nitride semiconductor layer 11 can be used. That is, when irradiated with a laser beam at a predetermined intensity of, for example, 600 mJ/cm2 from the growth substrate 30 side, such laser beam is absorbed by the n-type nitride semiconductor layer 11 (see FIG. 2B) which is located in the vicinity of the boundary between the growth substrate 30 and the n-type nitride semiconductor layer 11, and heat is generated in the vicinity of such boundary, thereby resulting in the separation. When, for example, the n-type nitride semiconductor layer 11 is GaN, the GaN absorbs light with a wavelength equal to or shorter than 365 nm, such that a KrF excimer laser beam (248 nm) can be used.

An explanation will now be given of the shape of the plating substrate 8 with reference to FIG. 8A to FIG. 8C.

Figure 8A:
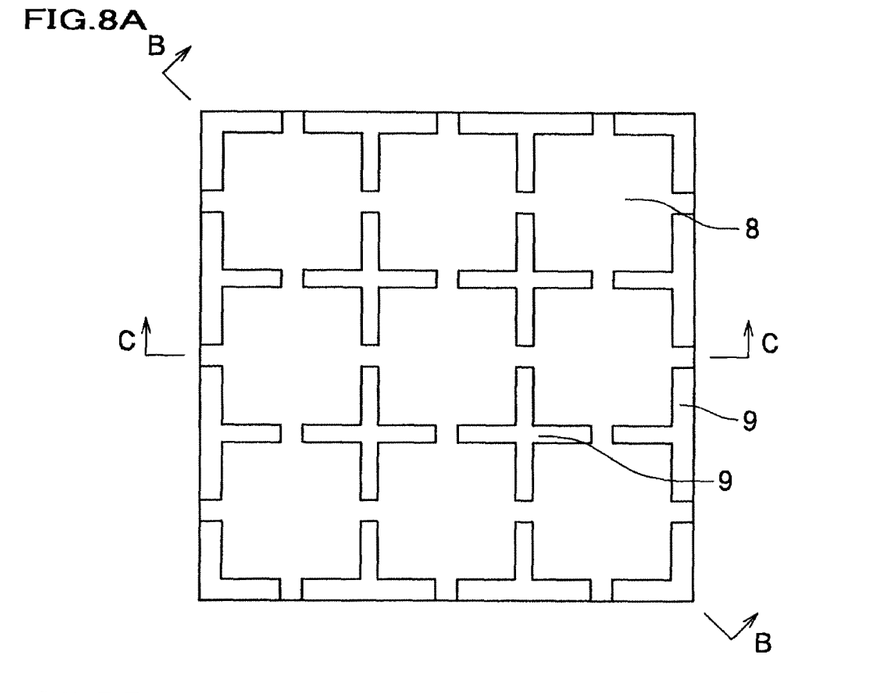
FIG. 8A is a plan view.

FIG. 8A is a plan view of the plating substrate 8 after the growth substrate 30 is peeled off from the nitride semiconductor layer 10. FIG. 8B is a cross sectional view taken along B-B line of FIG. 8A. FIG. 8C is a cross sectional view taken along C-C line of FIG. 8A.

As shown in FIG. 8A, the seed layer 9 can be seen through the spaces 40, but the plating substrate 8 is seen at other portions as viewed from the above.

Figure 8B:
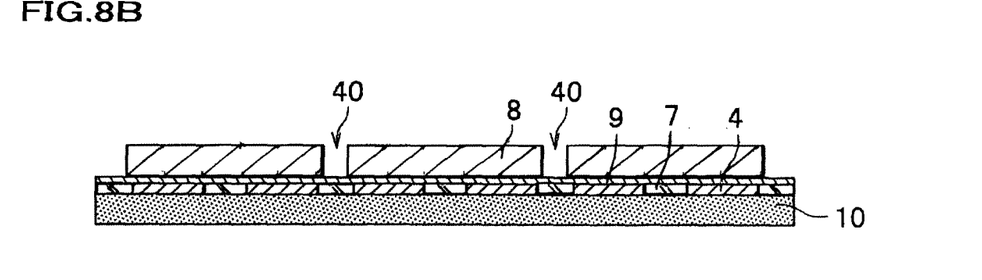
FIG. 8B is a cross sectional view taken along B-B line of FIG. 8A
Figure 8C:
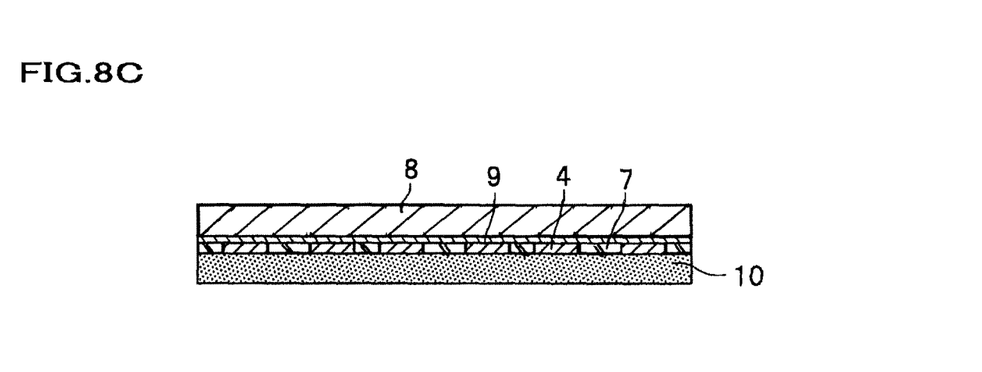
FIG. 8C is a cross sectional view taken along C-C line of FIG. 8A.

As shown in the cross sectional view of FIG. 8B taken along B-B line, the space 40 is formed between adjoining elements in the plating substrate 8. On the other hand, as shown in the cross sectional view of FIG. 8C taken along C-C line, the plating substrate 8 is continuously formed between adjoining elements in the plating substrate 8. As shown in FIG. 8C, since all elements are connected together through the continuous portion of the plating substrate 8 between adjoining elements, even if the spaces 40 shown in FIG. 8B is present, the wafer shape can be maintained as a whole.

Figure 9A:
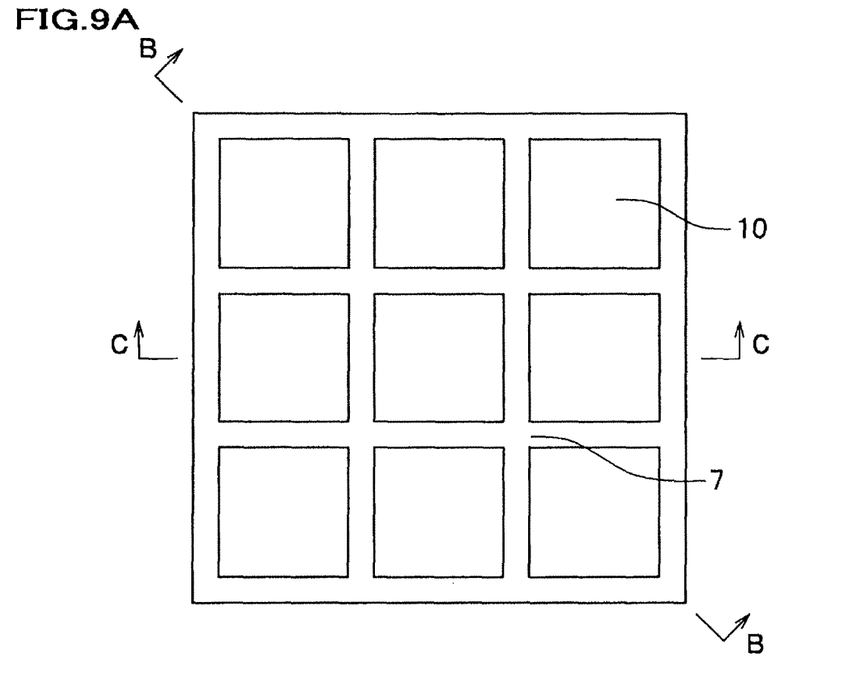
FIG. 9A is a plan view showing an element partition formation process after turning over top and bottom.
Figure 9B:
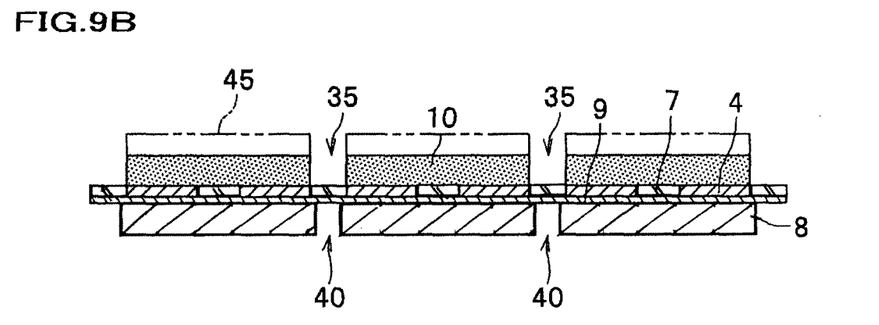
FIG. 9B is a cross sectional view taken along B-B line of FIG. 9A
Figure 9C:
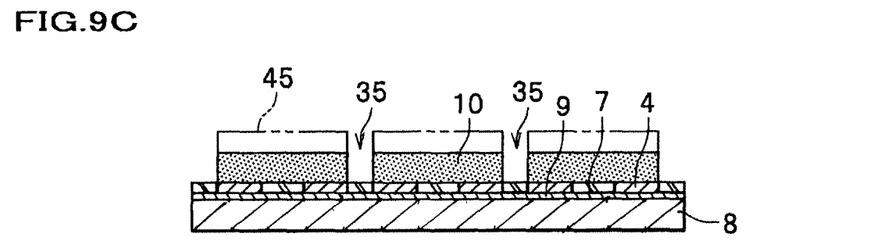
FIG. 9C is a cross sectional view taken along C-C line of FIG. 9A.

A subsequent process will be explained with reference to FIG. 9A to FIG. 9C. The plating substrate 8 is turned over top-to-bottom, and from the surface at the side of the n-type nitride semiconductor layer 11 (see FIG. 2B) of the nitride semiconductor layer 10, which is exposed by peeling off the growth substrate 30. The nitride semiconductor layer 10 is etched along the boundaries between the elements in order to form the grooves 35, and the elements are isolated so as to have a predetermined element size. FIG. 9A is a plan view after the grooves 35 are formed. FIG. 9B is a cross sectional view taken along B-B line of FIG. 9A. FIG. 9C is a cross sectional view taken along C-C line of FIG. 9A. In this process, a mask 45 is formed so as to cover a portion above the part where the p-electrode layer 4 is present, and the grooves 35 are formed using this mask 45. At this time, respective widths of the grooves 35 are set to be wider than respective widths of the spaces 40. The mask 45 can be made of, for example, SiO2. Next, the mask 45 is removed after the grooves 35 are formed. FIG. 9B and FIG. 9C show a state after the grooves 35 are formed; the mask 45 is indicated by a dashed line.

Figure 10A:
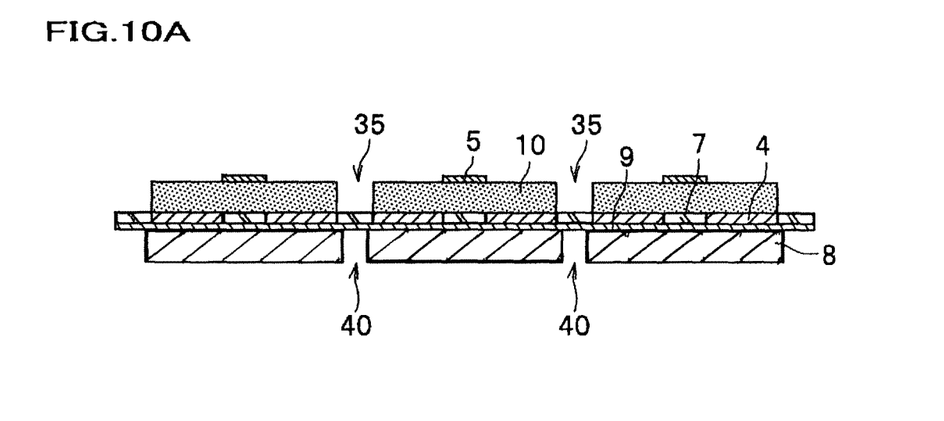
FIG. 10A is an n-electrode layer formation process and FIG. 10B is an n-passivation layer formation process.

Next, as shown in FIG. 10A, the n-electrode layer 5 is formed on the surface (upper surface) of the nitride semiconductor layer 10 at the side of the n-type nitride semiconductor layer 11 correspondingly to each element. At this time, the p-passivation layer 7 is positioned at a portion under the part where the n-electrode layer 5 is formed via the nitride semiconductor layer 10. Accordingly, the element assembly 2 shown in FIG. 1A to FIG. 1C can be obtained.

Figure 10B:
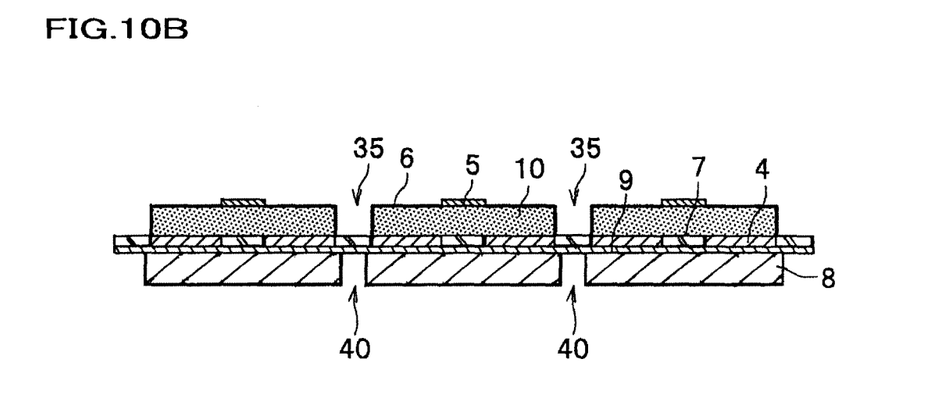

Next, as shown in FIG. 10B, the n-passivation layer 6 formed of an insulating material is formed on the whole upper surface of the nitride semiconductor layer 10, other than the portion where the n-electrode layer 5 is not formed, and on the side face of the nitride semiconductor layer 10. Since the n-passivation layer 6 is formed on the side face of the nitride semiconductor layer 10, it is possible to prevent the p-electrode layer 4 from forming a short circuit with the active layer 12 or the n-type nitride semiconductor layer 11, and to prevent the p-type nitride semiconductor layer 13 from forming a short circuit with the n-type nitride semiconductor layer 11. Also, the n-passivation layer 6 can be formed on the side face of the n-electrode layer 5 and on the edge of the upper surface of the n-electrode layer 5.

Furthermore, the turning-over state can be returned to an original state, and the plating substrate can be cut through the dicing streets along the boundaries between the elements. Accordingly, the semiconductor light emitting element 1 shown in FIG. 2A and FIG. 2B can be obtained. Regarding the cutting technique, for example, the plating substrate can be cut using a dicing saw. The cutting technique is not limited to the dicing saw and the plating substrate may be cut by laser, water jet, etc. In one embodiment, tabs of the plating substrate 8 can remain after dicing. The tabs correspond to remnants from the connections between the plating substrate 8 of an element and a plating substrate 8 of adjoining elements which were connected together via a part of the plating layer.

According to the fabrication method of a semiconductor light emitting element of this embodiment, the element assembly 2 having a plurality of elements each corresponding to the semiconductor light emitting element 1 can be formed in the wafer process, and the spaces 40 can be partially formed in the plating layer on the boundaries between the elements in the element assembly 2, so that the plating substrate 8 is formed. Accordingly, after the growth substrate 30 is peeled off from the nitride semiconductor layer 10, the stress of the metal plating is released by the spaces 40, so that an effect of reducing the warpage of the nitride semiconductor layer 10 and that of the plating substrate 8 can be obtained. In addition, in the process of cutting the plating substrate 8 along the boundaries between the elements, it is sufficient to cut the p-passivation layer 7 and seed layer 9 at the portion where the space 40 is present. The portion that connects adjoining elements between the spaces 40 of the plating substrate 8 can be easily cut. Advantageously, it is possible to fabricate a semiconductor light emitting element having the metal plating substrate which has little warpage distortion in the wafer process, facilitates the dicing, and is excellent in mass production.

Figure 11A:
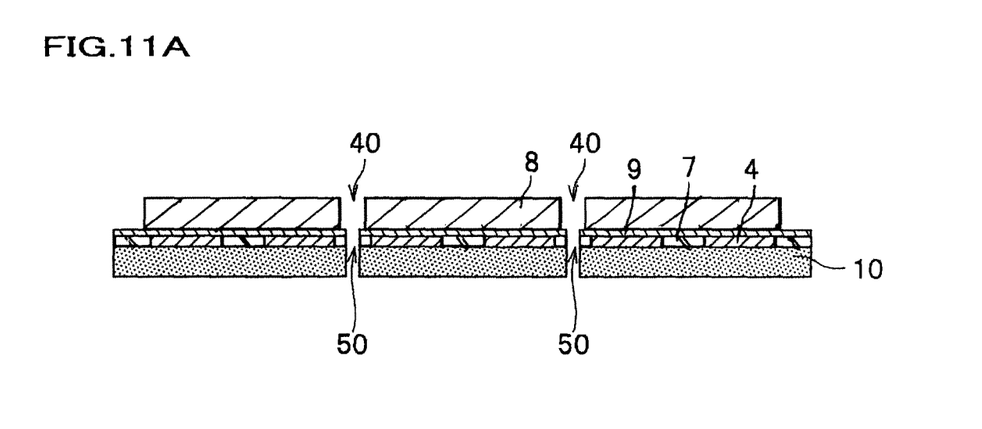
FIG. 11A is a status after a substrate peeling-off process and FIG. 11B is an n-passivation layer formation process.

The present invention is not limited to the above-explained embodiment, and can be changed and modified in various forms without departing from the scope and spirit of the present invention. For example, the explanation was given of a case in which the cross section of the space 40 taken along B-B line becomes the state shown in FIG. 8B after the growth substrate 30 is peeled off from the nitride semiconductor layer 10, but the present invention is not limited to this case. Depending on the thicknesses and materials of the nitride semiconductor layer 10, the p-passivation layer 7 and the seed layer 9, after the growth substrate 30 is peeled off from the nitride semiconductor layer 10, as shown in FIG. 11A, in the cross sectional view of the space 40 taken along B-B line, for example, the nitride semiconductor layer 10, the p-passivation layer 7 and the seed layer 9 may be cracked due to the stress of the nitride semiconductor layer 10 and that of the plating substrate 8, and a crack 50 that continues to the space 40 may be produced. In this case, however, as shown in the cross sectional view of FIG. 8C taken along line C-C, none of the nitride semiconductor layer 10, p-passivation layer 7 and seed layer 9 are cracked other than the portion where the space 40 is formed in the plating substrate 8. That is, since all elements are connected together through the connected portion of the plating substrate 8 between the elements, the wafer shape can be maintained.

Figure 11B:
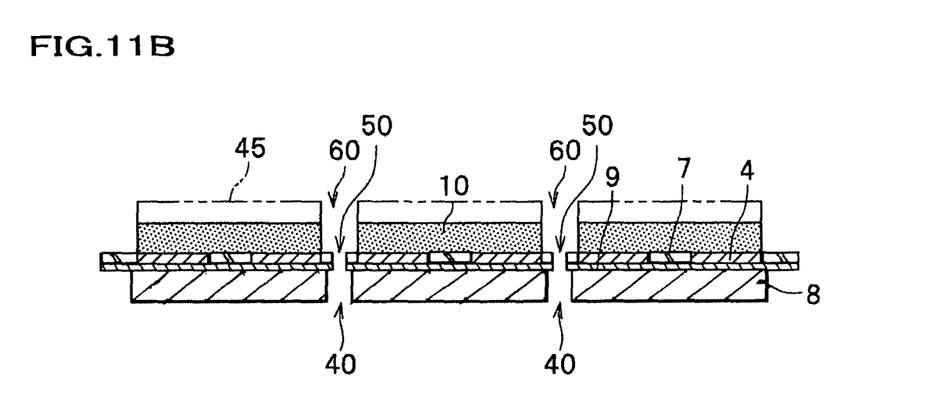

In addition, as shown in FIG. 11A, in the cross sectional view of the space 40 taken along B-B line, when the crack 50 is produced, if the element assembly is turned over top and bottom and the process of forming the grooves in the nitride semiconductor layer 10 is successively executed, the cross sectional view of the space 40 taken along B-B line becomes a state shown in FIG. 11B. In this case, even if there is the crack 50 in the nitride semiconductor layer 10 after the growth substrate 30 is peeled off, grooves 60 shown in FIG. 11B and the grooves 35 shown in FIG. 9B have the same width since the width of the groove 35 is set to be larger than the width of the space 40. That is, the crack 50 does not affect the shape of the semiconductor light emitting element 1 (in particular, the shape of the nitride semiconductor layer 10). In addition, the space 40 shown in FIG. 1C passes all the way through the nitride semiconductor layer 10, the p-passivation layer 7 and the seed layer 9. Since the space 40 passing therethrough can relieve the stress of the metal plating, the warpage of the nitride semiconductor layer 10 and that of the plating substrate 8 can be reduced.

Also, according to the above-explained embodiment, the nitride semiconductor layer 10 can be formed directly on the growth substrate 30. However, for example, a GaN buffer layer where GaN was grown at a low temperature may be formed on the growth substrate 30, and the n-type nitride semiconductor layer 11, the active layer 12 and the p-type nitride semiconductor layer 13 can be grown thereon. This enables a well-formed crystalline nitride semiconductor layer 10.

What is claimed is:

1. An apparatus comprising:
a first electrode layer disposed on at least one nitride semiconductor layer;
a seed layer disposed on the first electrode layer; and
a plating layer disposed on the seed layer opposite to the at least one nitride semiconductor layer,
wherein the nitride semiconductor layer includes a plurality of grooves formed in a longitudinal direction and a plurality of grooves formed in a lateral direction,
wherein the plating layer includes a plurality of plating substrates and a plurality of cross-shaped spaces,
wherein the plating substrates are partially separated from one another by legs of the cross-shaped spaces,
wherein the plating substrates are partially connected to one another via a part of the plating layer disposed between legs of the cross-shaped spaces, and
wherein each plating substrate is substantially rectangular with a tab projecting from at least one side of the plating substrate
wherein an entirety of a surface of the plating layer that faces the nitride semiconductor layer, including a surface of the part of the plating layer disposed between the legs of the cross-shaped spaces, is in a single plane.

2. The apparatus of claim 1, wherein the seed layer has a thickness greater than or equal to 0.1 micrometers and less than or equal to 0.5 micrometers.

3. The apparatus of claim 1, wherein the plating substrate has a thickness greater than or equal to 80 micrometers and less than or equal to 120 micrometers.

4. The apparatus of claim 1, further comprising a second electrode layer disposed on the at least one nitride semiconductor layer, wherein the second electrode layer is located opposite of the first electrode layer.

5. The apparatus of claim 1, wherein the plurality of grooves are aligned with the cross-shaped spaces.

6. The apparatus of claim 1, wherein:
the seed layer comprises at least one of Ni, Cu, or Au;
the plating substrate comprises at least one of Ni, Cu, or Au; and
the at least one nitride semiconductor layer comprises a p-type nitride semiconductor layer, a n-type nitride semiconductor layer, and an active layer.

7. The apparatus of claim 1, wherein each of the cross-shaped spaces comprises four rectangular legs, and wherein a length of each of the four rectangular legs is less than half of a side length of a corresponding plating substrate of the plurality of plating substrates.

8. The apparatus of claim 7, wherein a width of each of the four rectangular legs of the each of the cross-shaped spaces is greater than or equal to 40 micrometers.

9. The apparatus of claim 7, wherein a width of at least one of the grooves of the nitride semiconductor layer is wider than a width of a leg of a corresponding cross-shaped space of the plating substrate.

10. The apparatus of claim 9, further comprising:
a passivation layer disposed on the nitride semiconductor layer,
wherein a width of the passivation layer is wider than a width of a corresponding groove of the nitride semiconductor layer.

11. An apparatus comprising:
a first electrode layer on at least one nitride semiconductor layer, wherein the first electrode layer includes a first electrode;
a seed layer on the first electrode layer opposite to the nitride semiconductor layer;
a plating substrate on the seed layer; and
a second electrode layer disposed on the at least one nitride semiconductor layer, wherein the second electrode layer is located opposite of the first electrode,
wherein the plating substrate includes at least one tab projecting from at least one side of the plating substrate in a plan view of the apparatus
wherein an entirety of a surface of the latin substrate that faces the nitride semiconductor layer, including a surface of the at least one tab, is in a single plane.

12. The apparatus of claim 11, wherein the at least one tab covers less than half of a corresponding side of the plating substrate in a plan view of the apparatus.

13. The apparatus of claim 11, wherein at least one tab projects less than 20 micrometers from the at least one side of the plating substrate.

14. The apparatus of claim 11, wherein the seed layer has a thickness greater than or equal to 0.1 micrometers and less than or equal to 0.5 micrometers.

15. The apparatus of claim 11, wherein the plating substrate has a thickness greater than or equal to 80 micrometers and less than or equal to 120 micrometers.

16. The apparatus of claim 11, wherein:
the seed layer comprises at least one of Ni, Cu, or Au;
the plating substrate comprises at least one of Ni, Cu, or Au; and
the at least one nitride semiconductor layer comprises a p-type nitride semiconductor layer, a n-type nitride semiconductor layer, and an active layer.

17. The apparatus of claim 11, wherein the plating substrate is substantially rectangular.

18. The apparatus of claim 11, wherein the semiconductor layer is substantially rectangular.

19. The apparatus of claim 11, wherein the plating substrate was formed from a plating layer including a plurality of plating substrates separated by cross-shaped spaces, and wherein each plating substrate of the plurality of plating substrates was connected to at least one of the other plating substrates of the plurality of plating substrates.

20. The apparatus of claim 19, wherein each of the cross-shaped spaces comprises four rectangular legs, and wherein a length of each of the four rectangular legs is less than half of a side length of a corresponding plating substrate of the plurality of plating substrates.

21. The apparatus of claim 20, wherein a width of each of the four rectangular legs of the cross-shaped spaces is greater than or equal to 40 micrometers.

22. The apparatus of claim 20, wherein the nitride semiconductor layer was formed from a pre-dicing nitride semiconductor layer that includes a plurality of grooves formed in a longitudinal direction and a lateral direction, and wherein a width of at least one of the grooves of the pre-dicing nitride semiconductor layer is wider than a width of a leg of a corresponding cross-shaped space of the plating substrate.

23. The apparatus of claim 20, further comprising:
a passivation layer disposed on the nitride semiconductor layer,
wherein the nitride semiconductor layer was formed from a pre-dicing nitride semiconductor layer that includes a plurality of grooves formed in a longitudinal direction and a lateral direction, and
wherein a width of the passivation layer is wider than a width of a corresponding groove of the pre-dicing nitride semiconductor layer.

24. An apparatus comprising:
a first electrode layer disposed on at least one nitride semiconductor layer;
a seed layer disposed on the first electrode layer; and
a plating layer disposed on the seed layer opposite to the nitride semiconductor layer,
wherein the nitride semiconductor layer includes a plurality of grooves formed in a longitudinal direction and a lateral direction,
wherein the plating layer includes a plurality of plating substrates and a plurality of spaces,
wherein the plating substrates are partially separated from one another by the spaces,
wherein the plating substrates are partially connected to one another via a part of the plating layer disposed between the spaces, and
wherein the seed layer is exposed at bottoms of the spaces.

25. The apparatus of claim 24, wherein the seed layer has a thickness greater than or equal to 0.1 micrometers and less than or equal to 0.5 micrometers.

26. The apparatus of claim 24, wherein the plating substrate has a thickness greater than or equal to 80 micrometers and less than or equal to 120 micrometers.

27. The apparatus of claim 24, further comprising a second electrode layer disposed on the at least one nitride semiconductor layer, wherein the second electrode layer is located opposite of the first electrode layer.

28. The apparatus of claim 24, wherein the plurality of grooves are aligned with the spaces.

29. The apparatus of claim 24, wherein:
the seed layer comprises at least one of Ni, Cu, or Au;
the plating substrate comprises at least one of Ni, Cu, or Au; and
the at least one nitride semiconductor layer comprises a p-type nitride semiconductor layer, a n-type nitride semiconductor layer, and an active layer.

30. The apparatus of claim 24, wherein each plating substrate is substantially rectangular with a tab projecting from at least one side of the plating substrate.

31. The apparatus of claim 24, wherein a width of at least one of the grooves of the nitride semiconductor layer is wider than a width of a leg of a corresponding space of the plating substrate.

32. The apparatus of claim 24, further comprising:
a passivation layer disposed on the nitride semiconductor layer,
wherein a width of the passivation layer is wider than a width of a corresponding groove of the nitride semiconductor layer.

* * * * *